United States Patent
Wang et al.

(10) Patent No.: US 12,520,478 B2
(45) Date of Patent: Jan. 6, 2026

(54) METHOD FOR FABRICATING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Hong Wang, Hefei (CN); Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 430 days.

(21) Appl. No.: 18/152,779

(22) Filed: Jan. 11, 2023

(65) Prior Publication Data

US 2024/0040766 A1 Feb. 1, 2024

Related U.S. Application Data

(63) Continuation of application No. PCT/CN2022/112651, filed on Aug. 16, 2022.

(30) Foreign Application Priority Data

Aug. 1, 2022 (CN) .......................... 202210918006.1

(51) Int. Cl.
H10B 12/00 (2023.01)

(52) U.S. Cl.
CPC ........... *H10B 12/053* (2023.02); *H10B 12/03* (2023.02); *H10B 12/34* (2023.02); *H10B 12/488* (2023.02)

(58) Field of Classification Search
CPC .... H10B 12/053; H10B 12/34; H10B 12/488; H10B 12/03
See application file for complete search history.

(56) References Cited

U.S. PATENT DOCUMENTS 11,094,699 B1   8/2021   Brewer et al.
2017/0323953 A1  11/2017  Cheng et al.
(Continued)

FOREIGN PATENT DOCUMENTS

CN   103915441 A   7/2014
CN   110729189 A   1/2020
(Continued)

OTHER PUBLICATIONS

Taiwan Patent Office, First Office Action Issued in Application No. 112127398, Feb. 20, 2024, 6 pages.
(Continued)

*Primary Examiner* — Richard A Booth
(74) *Attorney, Agent, or Firm* — Kilpatrick Townsend & Stockton LLP

(57) ABSTRACT

Embodiments relate to a method for fabricating a semiconductor structure and a semiconductor structure. The method includes: providing a substrate, and forming an initial stack structure on the substrate, where the initial stack structure includes a first dielectric layer and a target semiconductor layer alternately stacked in sequence along a first direction adjacent to the substrate; forming, in the initial stack structure, a first trench isolation structure, a second trench isolation structure and a third trench isolation structure arranged at intervals along a second direction and extending along a third direction; forming two spaced gate trenches whose bottom surfaces contact an upper surface of the substrate, where a part of the target semiconductor layer positioned in the gate trench is exposed and suspended; and forming gate structures surrounding the target semiconductor layer in the gate trenches.

14 Claims, 11 Drawing Sheets

(56) References Cited

U.S. PATENT DOCUMENTS

| | | | |
|---|---|---|---|
| 2021/0118884 A1 | 4/2021 | Liaw | |
| 2022/0320113 A1* | 10/2022 | Yu | H01L 21/76877 |
| 2022/0416049 A1* | 12/2022 | Shao | H10D 30/6757 |
| 2023/0253255 A1* | 8/2023 | Long | H01L 21/76852 |
| | | | 438/197 |

FOREIGN PATENT DOCUMENTS

| | | | |
|---|---|---|---|
| CN | 111863609 A | 10/2020 | |
| CN | 113130494 A | 7/2021 | |
| CN | 113410255 A | 9/2021 | |
| CN | 114121820 A | 3/2022 | |
| CN | 114141712 A | 3/2022 | |
| CN | 114141713 A | 3/2022 | |
| CN | 114420644 A | 4/2022 | |
| TW | 202205534 A | 2/2022 | |
| TW | 202209678 A | 3/2022 | |
| WO | 2017171845 A1 | 10/2017 | |

OTHER PUBLICATIONS

ISA State Intellectual Property Office of the People's Republic of China, International Search Report Issued in Application No. PCT/CN2022/112651, Apr. 26, 2023, WIPO, 8 pages.

ISA State Intellectual Property Office of the People's Republic of China, International Search Report Issued in Application No. PCT/CN2023/088579, Jul. 1, 2023, WIPO, 8 pages.

\* cited by examiner

METHOD FOR FABRICATING SEMICONDUCTOR STRUCTURE AND SEMICONDUCTOR STRUCTURE

CROSS-REFERENCE TO RELATED APPLICATION

The present disclosure is a continuation of PCT/CN2022/112651, filed on Aug. 16, 2022, which claims priority to Chinese Patent Application No. 202210918006.1 titled "METHOD FOR FABRICATING SEMICONDUCTOR STRUCTURE AND SEMICONDUCTOR STRUCTURE" and filed to the State Intellectual Property Office on Aug. 1, 2022, the entire contents of which are incorporated herein by reference.

TECHNICAL FIELD

The present disclosure relates to the field of integrated circuit design and manufacturing technologies, and more particularly, to a method for fabricating a semiconductor structure and the semiconductor structure.

BACKGROUND

With continuous development of integrated circuit fabrication processes, the market puts forward higher requirements for storage capability and storage performance of semiconductor storage products. How to improve the storage capability of the semiconductor storage products on the premise of ensuring the storage performance of the semiconductor storage products has become a goal pursued by developers. Therefore, a three-dimensional stacked storage structure emerges.

The performance of transistors connected to word line structures in the three-dimensional stacked storage structure directly affects overall performance of the three-dimensional stacked storage structure. In a traditional method for fabricating the three-dimensional stacked storage structure, it is difficult to change gate sizes of the transistors. Moreover, with an increasing number of memory cells per unit volume in the three-dimensional stacked storage structure, a space volume occupied by the word line structures per unit volume and a pitch between the adjacent word line structures are continuously reduced, which reduces the performance and reliability of products fabricated while increasing complexity of the fabrication processes.

SUMMARY

According to various embodiments of the present disclosure, there are provided a method for fabricating a semiconductor structure, and the semiconductor structure.

According to some embodiments, an aspect of the present disclosure provides a method for fabricating a semiconductor structure. The method comprises: providing a substrate, and forming an initial stack structure on the substrate, where the initial stack structure comprises a first dielectric layer and a target semiconductor layer alternately stacked in sequence along a first direction, the first dielectric layer being adjacent to the substrate; forming, in the initial stack structure, a first trench isolation structure, a second trench isolation structure and a third trench isolation structure arranged at intervals along a second direction and extending along a third direction; forming two spaced gate trenches whose bottom surfaces contact an upper surface of the substrate, where a part of the target semiconductor layer positioned in the gate trench is exposed and suspended; and forming gate structures surrounding the target semiconductor layer in the gate trenches, where adjacent two of the gate structures along the first direction and the second direction are insulated from each other, where the first direction, the second direction, and the third direction are perpendicular to one another.

According to some embodiments, another aspect of the present disclosure provides a semiconductor structure, which is fabricated by means of the method for fabricating a semiconductor structure according to any one of the embodiments of the present disclosure.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 2 to FIG. 5a, FIG. 6a, FIG. 7a, FIG. 8a, FIG. 9a, FIG. 10a, FIG. 11a, FIG. 12, and FIG. 14 are schematic three-dimensional cross-sectional diagrams corresponding to different steps in a method for fabricating a semiconductor structure according to some embodiments of the present disclosure;

DETAILED DESCRIPTION

Figure 1:
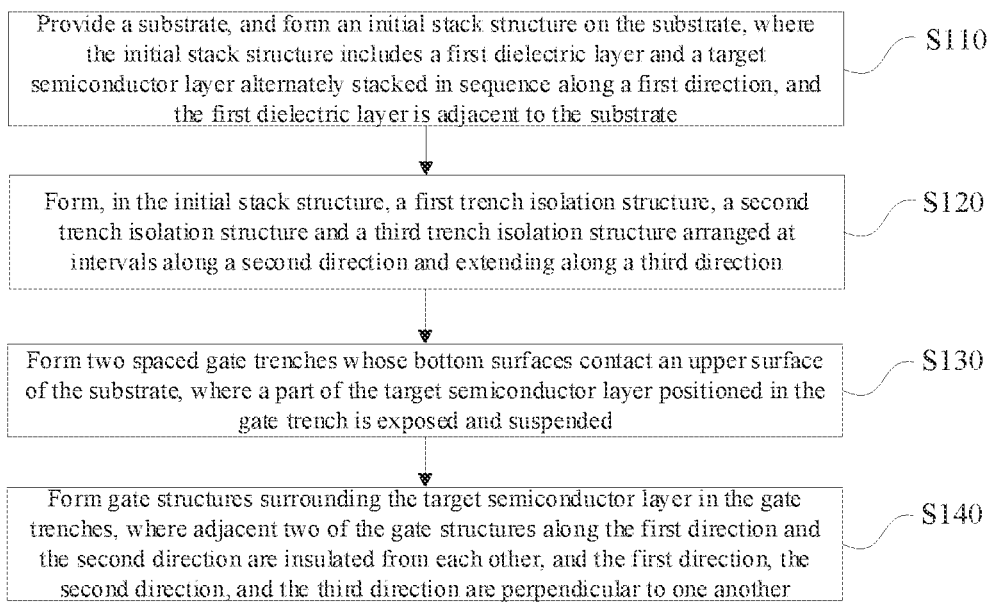
FIG. 1 is a schematic flow diagram of a method for fabricating a semiconductor structure according to an embodiment of the present disclosure.

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Thus, without departing from the teachings of the present disclosure, a first element, component, region, layer, doping type or portion discussed below may be represented as a second element, component, region, layer or portion. For example, a first doping type may be a second doping type, and similarly, the second doping type may be the first doping type. Furthermore, the first doping type and the second doping type may be different doping types. For example, the first doping type may be a P type and the second doping type may be an N type, or the first doping type may be the N type and the second doping type may be the P type.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should also be understood that the terms "comprising" and/or "including", when used in this specification, may determine the presence of the described features, integers, steps, operations, elements and/or components, but do not preclude the presence or addition of one or more other features, integers, steps, operations, elements, components, and/or groups thereof. Meanwhile, as used herein, the term "and/or" includes any and all combinations of related listed items.

It should be noted that the illustrations provided in this embodiment merely illustrate the basic idea of the present disclosure in a schematic manner. Although only the components related to the present disclosure are shown in the drawings rather than the number, shape and dimensional drawing of components in actual implementation. The form, number and proportion of each component in actual implementation may be a random change, and the component layout form thereof may be more complicated.

It is to be noted that mutual insulation between the two described in the embodiments of the present disclosure includes, but is not limited to, the presence of one or more of an insulating material, an insulating air gap or a spacing between the two.

To better meet a requirement of scaling down a device dimension, for a semiconductor process, planar transistors gradually begin to transition to three-dimensional transistors with higher power efficiency, such as gate-all-around (GAA) transistors. In the gate-all-around transistor, a gate surrounds, from all sides, a region where a channel is positioned. Compared with the planar transistor, the gate of the gate-all-around transistor has better capability to control the channel, and can better suppress a short channel effect. The gate-all-around transistor includes a lateral gate-all-around (LGAA) transistor and a vertical gate-all-around (VGAA) transistor. A channel and a gate structure of the LGAA extend in a direction parallel to the surface of the substrate, such that it is difficult to control a dimension of the gate structure and a dimension of a word line structure connected to the gate structure. Moreover, when number of memory cells per unit volume is increased, and the word line structure extending in the direction parallel to the surface of the substrate is directly formed on an outer side of the gate structure, a volume of the word line structure and a pitch between adjacent word line structures may be inevitably reduced, which reduces performance and reliability of products fabricated while increasing complexity of fabrication processes.

The present disclosure is intended to provide a method for fabricating a semiconductor structure and the semiconductor structure, which at least can increase space volume occupied by the word line structures and the pitch between the adjacent word line structures under the condition that the number of the memory cells per unit volume is not reduced, and can control the dimensions of the word line structures connected to the gate structures of the transistors, thereby improving the performance and the reliability of the products fabricated while reducing the complexity of the fabrication processes.

Referring to FIG. 1, in some embodiments of the present disclosure, there is provided a method of fabricating a semiconductor structure, comprising following steps: Step S110: providing a substrate, and forming an initial stack structure on the substrate, where the initial stack structure comprises a first dielectric layer and a target semiconductor layer alternately stacked in sequence along a first direction, the first dielectric layer being adjacent to the substrate; Step S120: forming, in the initial stack structure, a first trench isolation structure, a second trench isolation structure and a third trench isolation structure arranged at intervals along a second direction and extending along a third direction; Step S130: forming two spaced gate trenches whose bottom surfaces contact an upper surface of the substrate, where a part of the target semiconductor layer positioned in the gate trench is exposed and suspended; and Step S140: forming gate structures surrounding the target semiconductor layer in the gate trenches, where adjacent two of the gate structures along the first direction and the second direction are insulated from each other, and the first direction, the second direction, and the third direction are perpendicular to one another.

In some embodiments, after forming, in the initial stack structure, the first trench isolation structure, the second trench isolation structure and the third trench isolation structure arranged at intervals along the second direction and extending along the third direction, two spaced gate trenches whose bottom surfaces contact an upper surface of the substrate are formed, such that a part of the target semiconductor layer positioned in the gate trench is exposed and suspended, to form the gate structures surrounding the target semiconductor layer in the gate trenches. The part of the target semiconductor layer exposed and suspended in gate trenches may be trimmed and changed before the gate structures are formed, such that the dimensions of the gate structures formed subsequently may be controlled. The first trench isolation structure and the third trench isolation structure may be employed to form a bridge word line portion connected to the gate structures, and subsequently a plurality of layers of horizontal word line portions arranged at intervals are stacked in a direction perpendicular to the surface of the substrate, such that the horizontal word line portions are connected to the corresponding gate structures by means of the bridge word line portion. Compared to directly forming the plurality of layers of word line structures, on outer sides of the gate structures, stacked in the direction perpendicular to the surface of the substrate, in this embodiment, space volume occupied by the word line structures and a pitch between the adjacent word line structures can be increased at least under the condition that number of memory cells per unit volume is not reduced, thereby improving the performance and the reliability of the products fabricated while reducing the complexity of the fabrication processes.

Figure 2:
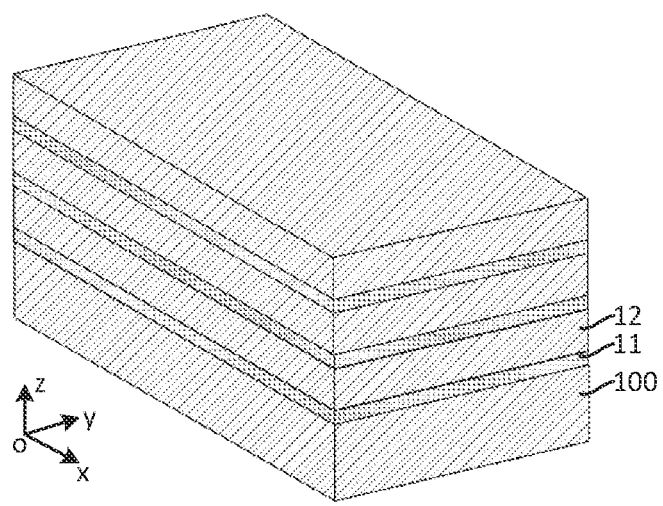
Figure 3:
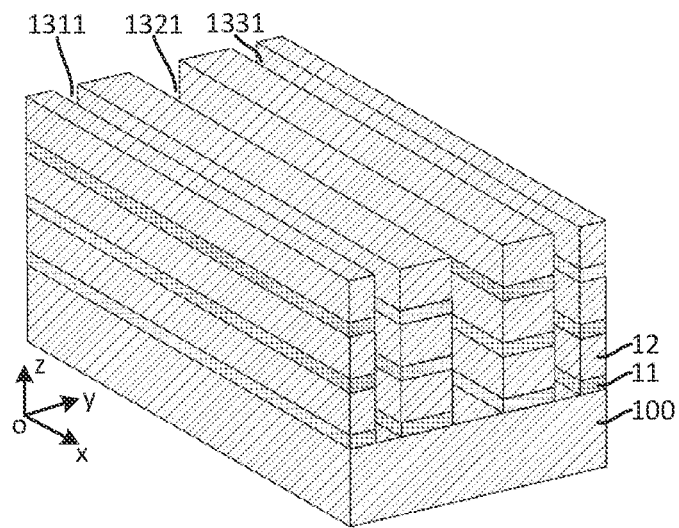

As an example, referring to FIG. 1 to FIG. 2, Step S110 may include following steps: Step S111: providing a substrate 100; and Step S112: forming an initial stack structure on the substrate 100, where the initial stack structure comprises a first dielectric layer 11 and a target semiconductor layer 12 alternately stacked in sequence along the first direction (e.g., an oz direction), and the first dielectric layer 11 is adjacent to the substrate 100.

For example, a first type of doped well region (not shown in the figures) is formed in the substrate 100, and the substrate may be made of a semiconductor material, an insulating material, a conductor material, or any combination thereof. The substrate 100 may be a single-layer structure or a multi-layer structure. For example, the substrate 100 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. In some embodiments, for another example, the substrate 100 may be a layered substrate including, for example, Si/SiGe, Si/SiC, silicon-on-insulator (SOI), or silicon-germanium-on-insulator. Therefore, the type of the substrate 100 should not limit the scope of protection of the present disclosure. P-type ions may be implanted into the substrate 100 by means of an ion implantation process to form the first type of doped well region (not shown in the figures). The P-type ions include, but are not limited to, any one or more of boron (B) ions, gallium (Ga) ions, boron fluoride (BF2) ions, and indium (In) ions. A material of the first dielectric layer 11 may include, but is not limited to, silicon germanium (SiGe), and a material of the target semiconductor layer 12 may include, but is not limited to, silicon (Si). The first dielectric layer 11 made of silicon germanium can completely transfer a silicon lattice of the substrate 100 to a stacked channel layer made of silicon, thereby ensuring that each channel layer made of silicon can have the same silicon lattice as the substrate 100.

As an example, referring to FIG. 1 to FIG. 4, a first trench 1311, a second trench 1321 and a third trench 1331 arranged at intervals along the second direction (e.g., an oy direction) and extending along the third direction (e.g., an ox direction) may be formed in the initial stack structure by means of an etching process in Step S120. The first trench 1311, the second trench 1321, and the third trench 1331 expose an upper surface of the substrate 100. The first direction (e.g., the oz direction), the second direction (e.g., the oy direction), and the third direction (e.g., the ox direction) are perpendicular to one another. The etching process may include, but is not limited to, a dry etching process and/or a wet etching process. The dry etching process may include, but is not limited to, one or more of reactive ion etching (RIE), inductively coupled plasma (ICP) etching, and high-density plasma (HDP) etching. The isolation material is then deposited in the first trench 1311, the second trench 1321, and the third trench 1331 by means of a deposition process to obtain the first trench isolation structure 131, the second trench isolation structure 132, and the third trench isolation structure 133. The bottom surface of the first trench isolation structure 131, the bottom surface of the second trench isolation structure 132, and the bottom surface of the third trench isolation structure 133 are in contact with the upper surface of the substrate 100. After the first trench isolation structure 131, the second trench isolation structure 132, and the third trench isolation structure 133 are formed, a chemical mechanical polish (CMP) process is employed such that the upper surface of the first trench isolation structure 131, the upper surface of the second trench isolation structure 132, and the upper surface of the third trench isolation structure 133 are flush with the upper surface of the initial stack structure, to subsequently form the first mask layer having a flat surface on the upper surface of the first trench isolation structure 131, the upper surface of the second trench isolation structure 132, and the upper surface of the third trench isolation structure 133, and to etch the initial stack structure using the first mask layer patterned to obtain the gate trench, thereby improving the morphology controllability of the gate trench etched. The isolation material within the first trench isolation structure 131, the second trench isolation structure 132 and the third trench isolation structure 133 may include one or more of polysilicon, silicon nitride, silicon oxide, silicon oxynitride, and the like. The deposition process may include, but is not limited to, one or more of a chemical vapor deposition (CVD) process, an atomic layer deposition (ALD) process, a high-density plasma (HDP) process, a plasma enhanced deposition process, and a spin-on dielectric (SOD) layer.

Figure 4:
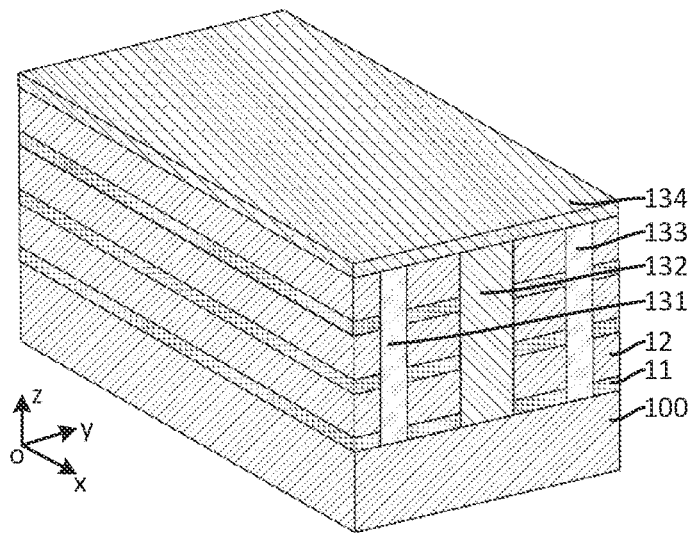

As an example, with continued reference to FIG. 4, the initial stack structure is symmetrical about an symmetrical axis extending along the third direction (e.g., the ox direction) of the second trench isolation structure 132, which is advantageous to monitoring structural parameters and electrical parameters of the products fabricated while improving symmetry of the semiconductor structure fabricated and reducing the process complexity.

As an example, with continued reference to FIG. 4, the thickness of the target semiconductor layer 12 may range from 60 nm to 100 nm. For example, the thickness of the target semiconductor layer 12 may be 60 nm, 70 nm, 80 nm, 90 nm, or 100 nm, etc. The thickness of the first dielectric layer 11 may range from 5 nm to 20 nm. For example, the thickness of the first dielectric layer 11 may be 5 nm, 10 nm, 15 nm, or 20 nm, etc. The first dielectric layer 11 itself provides a tensile stress, and each layer cannot be too thick, otherwise problems such as body inclination are likely to occur. Defects inevitably exist in the process of fabrication of the target semiconductor layer 12, and increasing its thickness means increasing probability and/or number of defect locations. If the first dielectric layer 11 made of silicon germanium is too thick and has more defects, lattice mismatch of the target semiconductor layer 12 at the top may be more serious.

As an example, referring to FIG. 1, FIGS. 4 to 5b, the step of forming two spaced gate trenches 14 whose bottom surfaces contact an upper surface of the substrate in Step S130 may include following steps: Step S131: forming a first mask layer 134, where the first mask layer 134 covers an upper surface of the first trench isolation structure 131, an upper surface of the second trench isolation structure 132, and an upper surface of the third trench isolation structure 133; and Step S132: patterning the first mask layer 134, and etching the initial stack structure using the first mask layer 134 patterned as a mask to obtain gate trenches 14, where a remaining part of the first trench isolation structure 131 and a remaining part of the third trench isolation structure 133 positioned on two opposite sides of each of the gate trenches 14 along the second direction (e.g., the oy direction) constitute a first side wall 141 of each of the gate trenches 14.

As an example, with continued reference to FIG. 4, the first mask layer 134 covering the upper surface of the first trench isolation structure 131, the upper surface of the second trench isolation structure 132 and the upper surface of the third trench isolation structure 133 may be formed by means of the deposition process in Step S131. The first mask layer 134 may include a single-layer structure or a multi-layer structure. The first mask layer 134 includes, but is not limited to, a hard mask layer. The hard mask layer is, for example, a spin-on hard mask (SOH) layer. The SOH layer may be an insulating layer of a hydrocarbon ($C_XH_Y$) system, which may include a silicon hard mask material, a carbon hard mask material, an organic hard mask material, and the like. As an auxiliary material for forming a semiconductor micro-pattern, the SOH has the characteristics of filling gaps, increasing flatness, enhancing corrosion resistance, and the like. Employing this material to form the hard mask layer may make the subsequent etching effect better. The deposition process may include, but is not limited to, one or more of CVD, ALD, HDP, SOD, and the like.

Figure 5A:
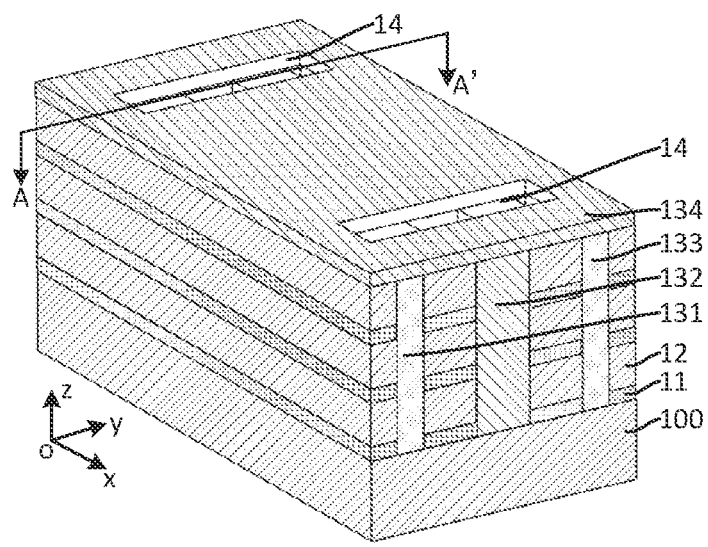
Figure 5B:
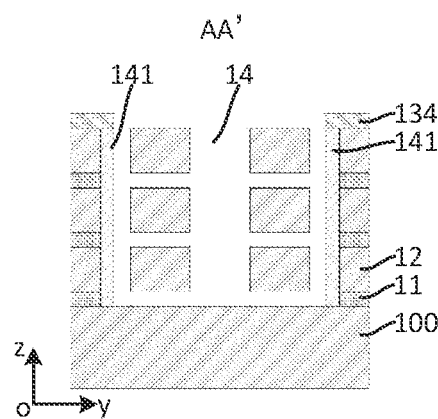
FIG. 5b is a schematic cross-sectional structural diagram of a three-dimensional structure shown in FIG. 5a along a direction AA'.

As an example, with continued reference to FIG. 5a and FIG. 5b, in Step S132, the initial stack structure may be etched using the first mask layer 134 patterned as a mask and using a dry etching process and a wet etching process to obtain the gate trench 14. A part of the target semiconductor layer 12 positioned in the gate trench is exposed and suspended. A remaining part of the first trench isolation structure 131 and a remaining part of the third trench isolation structure 133 positioned on two opposite sides of the gate trench 14 along the second direction (e.g., the oy direction) constitute the first side wall 141 of the gate trench 14 to protect the side wall of the gate trench 14. The exposed and suspended part of the target semiconductor layer 12 within the gate trench 14 may be trimmed and changed before the gate structure is formed, such that the dimension of the gate structure subsequently formed may be controlled.

Figure 5C:
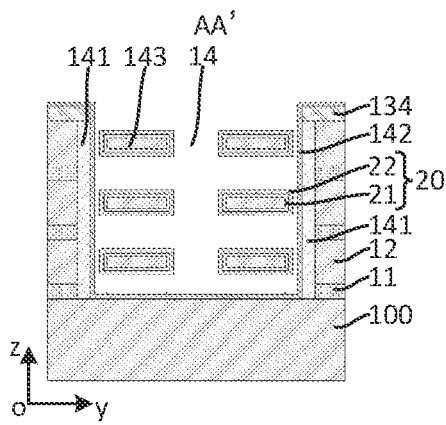
FIG. 5c is a schematic cross-sectional structural diagram of a three-dimensional structure shown in FIG. 5a along the direction AA' after a gate structure is formed according to an embodiment of the present disclosure.

As an example, referring to FIGS. 1 and 5c, the forming a gate structure 20 surrounding the target semiconductor layer 12 in the gate trench 14 in Step S140 may include following steps: Step S141: trimming a part of the target semiconductor layer 12 positioned in the gate trench 14 along an inner diameter direction of the target semiconductor layer 12 to obtain a gate support pillar 143; Step S142: forming a gate oxide layer 21 on an outer surface of the gate support pillar 143; and Step S143: depositing a metal material layer, where a part of the metal material layer surrounding the gate oxide layer 21 constitutes a gate metal layer 22, and the gate oxide layer 21 and the gate metal layer 22 constitute the gate structure 20.

As an example, with continued reference to FIG. 5c, in Step S141, a part of the target semiconductor layer 12 positioned in the gate trench 14 may be trimmed along the inner diameter direction of the target semiconductor layer 12 by means of the etching process. By controlling an etching rate and etching time of the etching process, the thickness of the target semiconductor layer 12 removed may be controlled, thereby controlling the thickness of the gate support pillar 143 and a length thereof along the oy direction, and controlling the thickness of a gate oxide layer 21 or gate metal layer 22 subsequently formed on the outer surface of the gate support pillar 143, and the length thereof along the oy direction. The etching process may include, but is not limited to, a dry etching process and/or a wet etching process. The dry etching process may include, but is not limited to, any one or more of ME, ICP, HDP, and the like.

As an example, with continued reference to FIG. 5c, the gate oxide layer 21 may be formed on the outer surface of the gate support pillar 143 in the gate trench 14 by means of any one or more of an in-situ steam generation (ISSG) process, an atomic layer deposition process, a plasma steam deposition process, and a rapid thermal oxidation (RTO) process in Step S142. The gate oxide layer 21 may be formed of a high-k dielectric constant material. For example, a material of the gate oxide layer 21 may include, but is not limited to, any one or more of alumina ($Al_2O_3$), hafnium oxide ($HfO_2$), hafnium oxide nitrogen (HfON), zirconia ($ZrO_2$), tantalum oxide ($Ta_2O_5$), titanium oxide ($TiO_2$), strontium titanium oxide ($SrTiO_3$), and the like.

As an example, with continued reference to FIG. 5c, a metal material layer may be formed by means of the deposition process in Step S143. A part of the metal material layer positioned on the first side wall 141 constitutes a second side wall 142. A part of the metal material layer surrounding the gate oxide layer 21 constitutes a gate metal layer 22. The gate oxide layer 21 and the gate metal layer 22 constitute the gate structure 20. The deposition process may include, but is not limited to, one or more of a chemical vapor deposition (CVD) process, an atomic layer deposition (ALD) process, a high-density plasma (HDP) process, a plasma enhanced deposition process, and a spin-on dielectric (SOD) layer. The metal material layer may include, but is not limited to, any one or more of titanium nitride (TiN), titanium (Ti), tungsten silicide ($Si_2W$), tungsten (W), and the like. Because the thickness of the target semiconductor layer 12 removed may be controlled during trimming the target semiconductor layer 12, the thickness of the gate support pillar 143 and the length thereof along the oy direction may be controlled, such that the thickness of the gate oxide layer 21 or the gate metal layer 22 subsequently formed on the outer surface of the gate support pillar 143 and the length thereof along the oy direction may be controlled, thereby controlling the dimension of the gate structure 20 fabricated.

As an example, referring to FIG. 1 and FIGS. 6a to 8b, after forming the gate structure 20 surrounding the target semiconductor layer 12 in the gate trench 14 in Step S140, the method may further include following steps: Step S151: filling a first low dielectric constant material layer 144 in the gate trench 14, where an upper surface of the first low dielectric constant material layer 144 is flush with the upper surface of the initial stack structure; Step S152: removing the first side wall 141, the second side wall 142, and part of the initial stack structure to obtain a word line auxiliary trench 15 extending along the third direction and having a bottom surface contacting the upper surface of the substrate 100; and Step S153: filling a second low dielectric constant material layer 16 in the word line auxiliary trench 15, where an upper surface of the second low dielectric constant material layer 16 is flush with the upper surface of the initial stack structure.

Figure 6A:
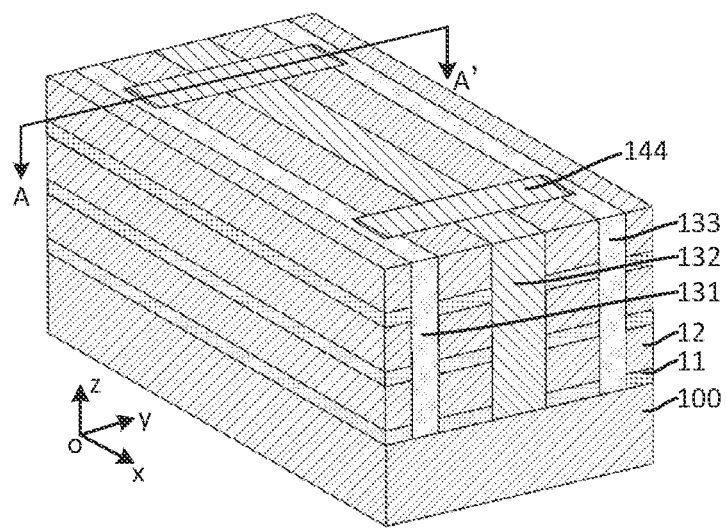
Figure 6B:
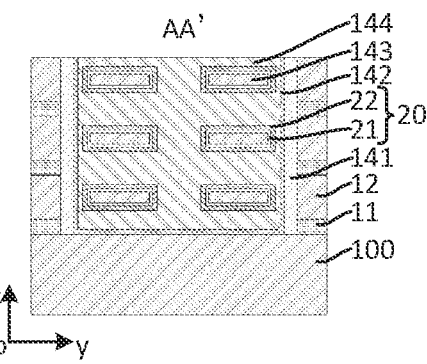
FIG. 6b is a schematic diagram of a cross-sectional structure of a three-dimensional structure shown in FIG. 6a along a direction AA'.

As an example, with continued reference to FIG. 6a and FIG. 6b, in Step S151, the first low dielectric constant material layer 144 may be filled in the gate trench 14 by means of any one or more of the ISSG process, the atomic layer deposition process, the plasma steam deposition process, the RTO process, and the like. Next, the upper surface of the first low dielectric constant material layer 144 may be planarized along the thickness direction (e.g., the oz direction) by means of any one or more of the wet etching process, the dry etching process, the chemical mechanical polishing process, a lateral etching process, and the like, such that the upper surface of the first low dielectric constant material layer 144 is flush with the upper surface of the initial stack structure to facilitate protection of the gate structure 20 during subsequent etching and formation of the word line trench.

Figure 7A:
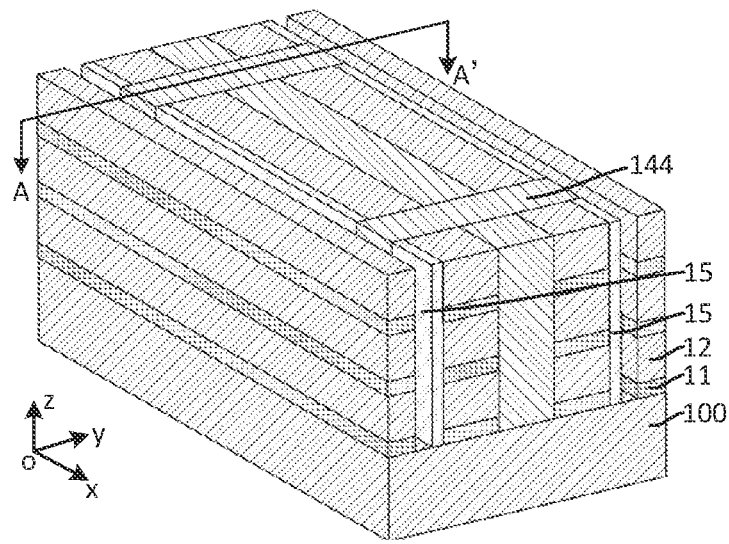
Figure 7B:
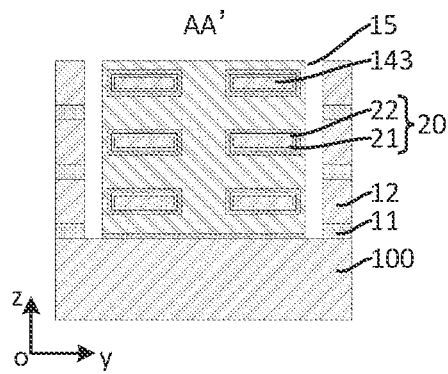
FIG. 7b is a schematic diagram of a cross-sectional structure of a three-dimensional structure shown in FIG. 7a along a direction AA'.

As an example, with continued reference to FIG. 7a and FIG. 7b, the first side wall 141, the second side wall 142, and part of the initial stack structure may be removed by means of an etching process in Step S152 to obtain a word line auxiliary trench 15 extending along the third direction (e.g., the ox direction) and having a bottom surface contacting the upper surface of the substrate 100, such that a bridge word line portion connected to the gate structure may be formed subsequently by means of the word line auxiliary trench 15. Subsequently, a plurality of layers of horizontal word line portions arranged at intervals are stacked in a direction perpendicular to the upper surface of the substrate 100, such that the horizontal word line portions are connected to the corresponding gate structures by means of the bridge word line portion. Compared to directly forming the plurality of layers of word line structures, on outer sides of the gate structures, stacked in the direction perpendicular to the upper surface of the substrate 100, in this embodiment, space volume occupied by the word line structures and the pitch between the adjacent word line structures can be increased at least under the condition that the number of the memory cells per unit volume is not reduced, thereby improving the performance and the reliability of the products fabricated while reducing the complexity of the fabrication processes. The etching process may include, but is not limited to, a dry etching process and/or a wet etching process. The dry etching process may include, but is not limited to, any one or more of RIE, ICP, HDP, and the like.

Figure 8A:
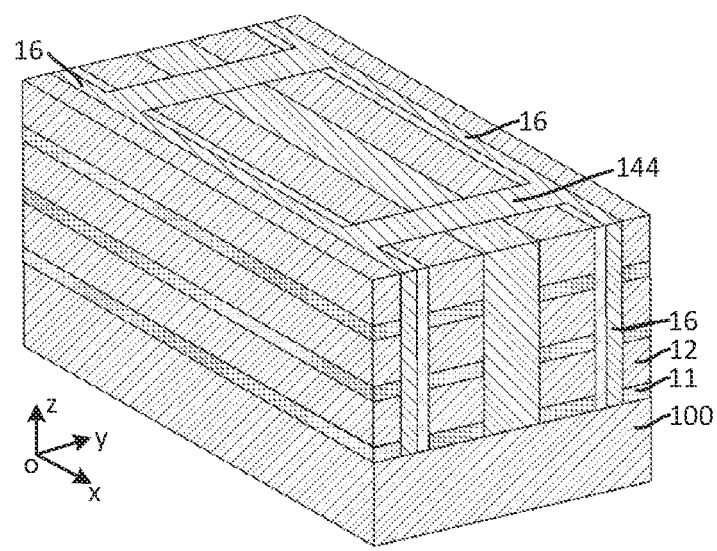
Figure 8B:
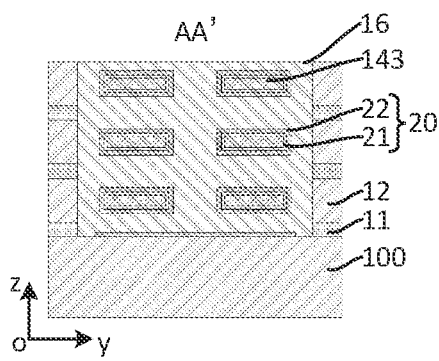
FIG. 8b is a schematic diagram of a cross-sectional structure of a three-dimensional structure shown in FIG. 8a along a direction AA'.

As an example, with continued reference to FIG. 8a and FIG. 8b, a second low dielectric constant material layer 16 may be filled in the word line auxiliary trench 15 by means of the deposition process in Step S153. Next, the upper surface of the second low dielectric constant material layer 16 may be planarized along the thickness direction (e.g., the oz direction) by means of any one or more of the wet etching process, the dry etching process, the chemical mechanical polishing process, the lateral etching process, and the like, such that the upper surface of the second low dielectric constant material layer 16 is flush with the upper surface of the initial stack structure to facilitate protection of the gate structure 20 during subsequent etching and formation of the word line trench. The deposition process may include, but is not limited to, any one or more of CVD, ALD, HDP, SOD, and the like.

As an example, referring to FIG. 1 and FIGS. 9a to 10b, after forming the gate structure 20 surrounding the target semiconductor layer 12 in the gate trench 14 in Step S140, the method may further include following steps: Step S161: removing a part of the target semiconductor layer 12 positioned on two opposite sides of each of the gate trenches 14 along the second direction, and removing a part of the second low dielectric constant material layer 16 positioned between adjacent two of the first dielectric layers 11 along the first direction to obtain a first word line portion trench 41; Step S162: etching the first low dielectric constant material layer 144 along the second direction using the gate metal layer 22 as an etching stop layer, to obtain a second word line portion trench (not shown); and Step S163: forming a first word line portion 31 in the first word line portion trench 41, and forming a second word line portion 32 in the second word line portion trench (not shown), where the first word line portion 31 and the second word line portion 32 constitute a word line structure 30.

Figure 9A:
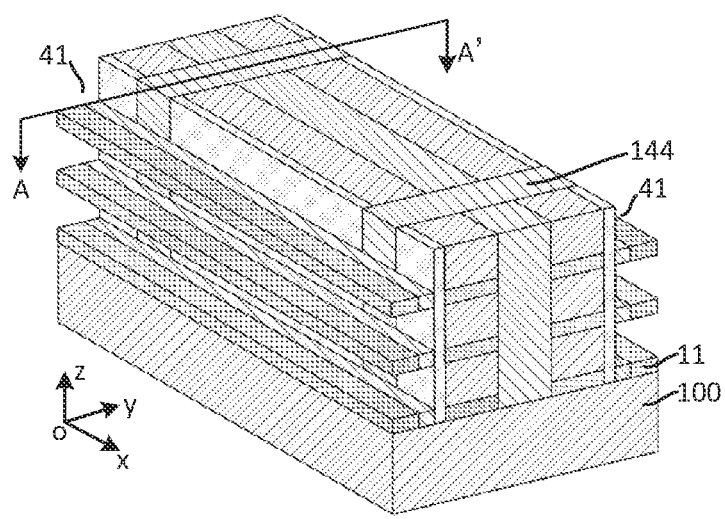
Figure 9B:
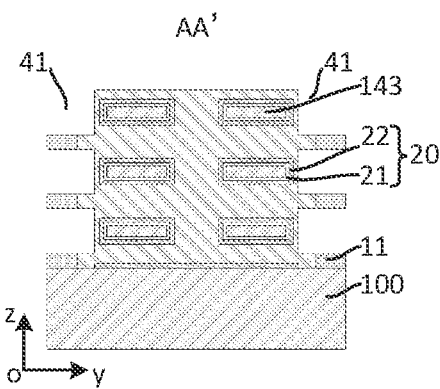
FIG. 9b is a schematic diagram of a cross-sectional structure of a three-dimensional structure shown in FIG. 9a along a direction AA'.
Figure 10A:
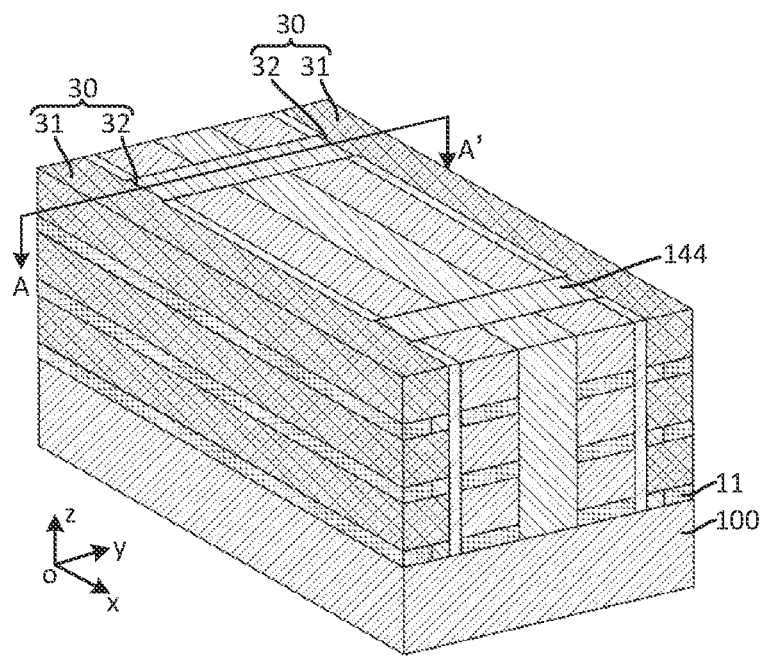
Figure 10B:
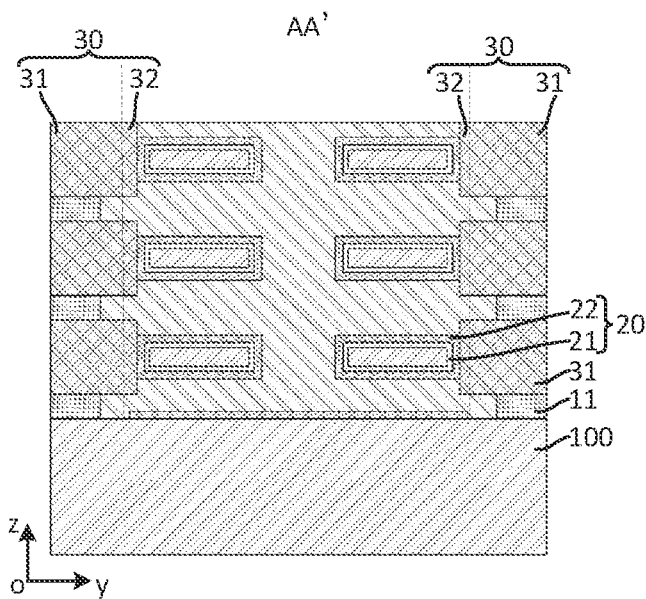
FIG. 10b is a schematic diagram of a cross-sectional structure of a three-dimensional structure shown in FIG. 10a along a direction AA'.

As an example, with continued reference to FIG. 9a and FIG. 9b, in Step S161, the etching process may be employed to remove a part of the target semiconductor layer 12 positioned on two opposite sides of the gate trench 14 along the second direction (e.g., the oy direction), and to remove a part of the second low dielectric constant material layer 16 positioned between the adjacent first dielectric layers 11 along the first direction (e.g., the oz direction), thereby obtaining the first word line portion trench 41. The etching process may include, but is not limited to, a dry etching process and/or a wet etching process. The dry etching process may include, but is not limited to, any one or more of RIE, ICP, HDP, and the like.

As an example, with continued reference to FIG. 9a, a length of the second word line portion 32 along the third direction (e.g., ox direction) is equal to that of the gate structure 20 along the third direction (e.g., ox direction) to reduce a connection impedance between the word line structure 30 and the gate structure 20.

As an example, with continued reference to FIG. 9a to FIG. 10b, in Step S162, the gate metal layer 22 may be used as an etching stop layer, and the first low dielectric constant material layer 144 may be etched along the second direction by means of the etching process to obtain the second word line portion trench. The etching process may include, but is not limited to, a dry etching process and/or a wet etching process. The dry etching process may include, but is not limited to, any one or more of RIE, ICP, HDP, and the like. In Step S163, the first word line portion 31 may be formed in the first word line portion trench 41 by means of the deposition process, and the second word line portion 32 may be formed in the second word line portion trench (not shown in the figure). The first word line portion 31 and the second word line portion 32 constitute the word line structure 30. The first word line portion 31 and the second word line portion 32 may be fabricated and formed in the same process step, or may be fabricated and formed in different process steps. The deposition process may include, but is not limited to, any one or more of CVD, ALD, HDP, SOD, and the like. The material of the word line structure 30 may include, but is not limited to, any one or more of rubidium, cobalt, nickel, titanium, tungsten, tantalum, tantalum titanium, tungsten nitride, copper, aluminum, and the like.

Figure 11A:
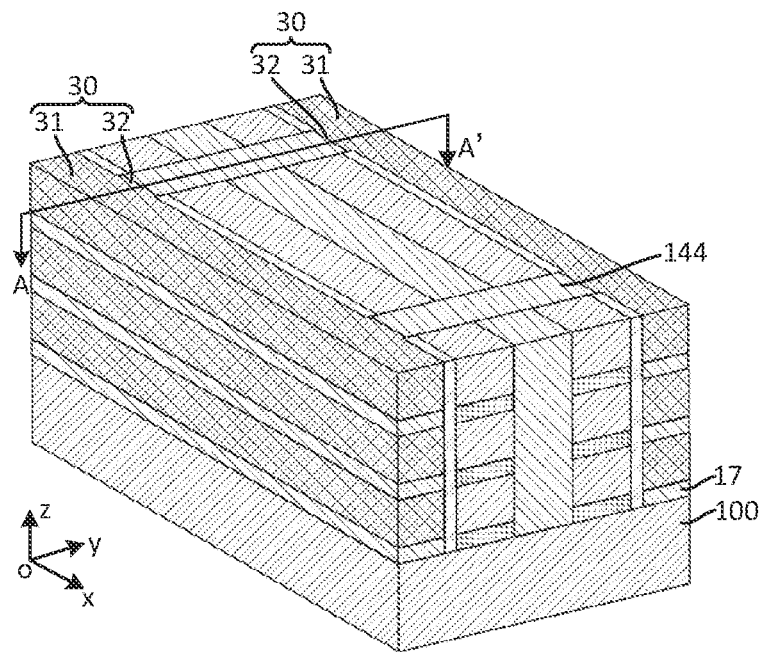
Figure 11B:
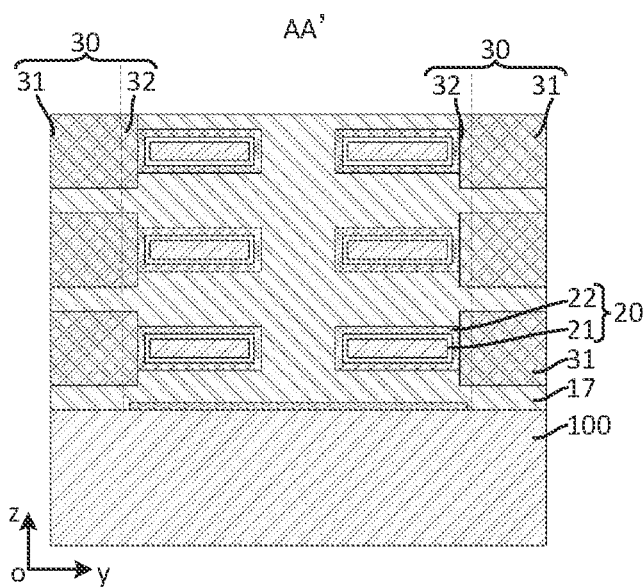
FIG. 11b is a schematic diagram of a cross-sectional structure of a three-dimensional structure shown in FIG. 11a along a direction AA'.

As an example, referring to FIG. 11a and FIG. 11b, after forming the word line structure 30 in Step S163, the method may further include following steps: Step S171: removing a part of the first dielectric layer 11 positioned on two opposite sides of each of the gate trenches 14 along the second direction (e.g., oy direction) to obtain a word line isolation trench (not shown); and Step S172: forming a third low dielectric constant material layer 17 in the word line isolation trench.

As an example, with continued reference to FIG. 11a and FIG. 11b, in Step S171, a part of the first dielectric layer 11 positioned on two opposite sides of the gate trench 14 along the second direction may be removed by means of the etching process to obtain the word line isolation trench (not shown in the figures). The etching process may include, but is not limited to, a dry etching process and/or a wet etching process. The dry etching process may include, but is not limited to, any one or more of RIE, ICP, HDP, and the like. In Step S172, the third low dielectric constant material layer 17 may be formed in the word line isolation trench by means of the deposition process, such that the adjacent word line structures 30 are insulated from each other along the oz direction. The deposition process may include, but is not limited to, any one or more of CVD, ALD, HDP, SOD, and the like. At least two of the first low dielectric constant material layer 144, the second low dielectric constant material layer 16, and the third low dielectric constant material layer 17 have the same material. The low dielectric constant material layer may include, but is not limited to, any one or more of silicon oxide, SiLK, MSQ, porous SiLK, porous MSQ, and the like. Compared to directly forming the plurality of layers of word line structures, on the outer sides of the gate structures, stacked in the direction perpendicular to the surface of the substrate, in this embodiment, space volume occupied by the word line structures and the pitch between the adjacent word line structures can be increased at least under the condition that the number of the memory cells per unit volume is not reduced, thereby improving the performance and the reliability of the products fabricated while reducing the complexity of the fabrication processes.

Figure 12:
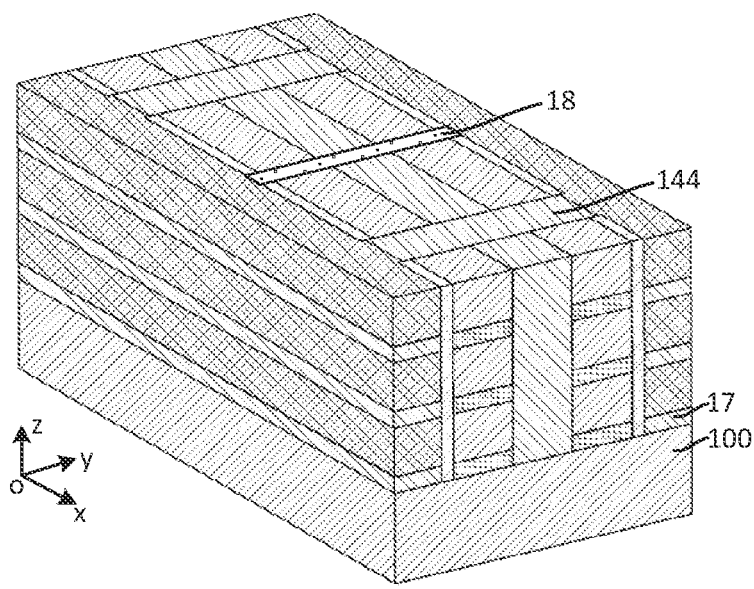
Figure 13:
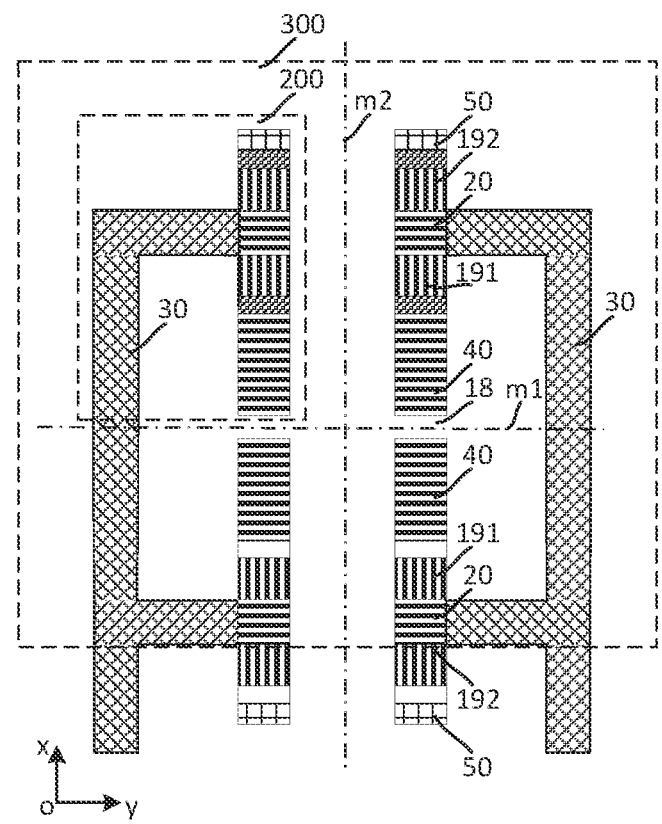
FIG. 13 is a schematic vertical view of a memory cell structure according to an embodiment of the present disclosure.

As an example, referring to FIG. 12 and FIG. 13, two gate trenches 14 may be provided symmetrically to each other along the third direction (e.g., the ox direction). After forming the third low dielectric constant material layer 17 in the word line isolation trench in Step S172, the method may further include following steps: Step S181: forming, between the two gate trenches 14, a body isolation structure 18 whose bottom surface contacts the upper surface of the substrate 100; and Step S182: forming a source structure 191 between the body isolation structure 18 and the gate structure 20 adjacent thereto, and forming a drain structure 192 on a side of the gate structure 20 distant from the body isolation structure 18 along the third direction (e.g., the ox direction).

As an example, with continued reference to FIG. 12, in Step S181, the initial stack structure may be etched by means of the etching process to obtain a body isolation trench (not shown in the figure), where the etching process may include, but is not limited to, a dry etching process and/or a wet etching process. The dry etching process may include, but is not limited to, any one or more of RIE, ICP, HDP, and the like. An isolation material is then deposited in the body isolation trench to obtain a body isolation structure 18. The deposition process may include, but is not limited to, any one or more of CVD, ALD, HDP, SOD, and the like. The isolation material may include any one or more of silicon nitride, silicon oxide, silicon oxynitride, and polysilicon, etc.

As an example, with continued reference to FIG. 13, the position of the body isolation structure 18 may be set, such that the semiconductor structure fabricated is symmetrical about an symmetrical axis m1 extending along the oy direction of the body isolation structure 18, or the gate structures 20 adjacent along the oy direction may be provided symmetrically about a symmetrical axis m2.

As an example, with continued reference to FIG. 13, in Step S182, a source structure 191 may be formed on the target semiconductor layer between the body isolation structure 18 and the gate structure 20 adjacent thereto, and the drain structure 192 may be formed on the target semiconductor layer on a side of the gate structure 20 distant from the body isolation structure 18 along the third direction (e.g., the ox direction), to obtain a memory cell structure 200. The source structures 191 adjacent along the ox direction are symmetrical about the symmetrical axis m1, and the drain structures 192 adjacent along the ox direction are symmetrical about the symmetrical axis m1. In this embodiment, a plurality of body structures 300 arranged at intervals along the oz direction are obtained; and each of the body structures 300 includes four center-symmetrical memory cell structures 200. A part of the target semiconductor layer exposed and suspended in the gate trenches may be trimmed and changed before the gate structures are formed, such that the dimensions of the gate structures formed subsequently may be controlled. The first trench isolation structure and the third trench isolation structure may be employed to form the bridge word line portion connected to the gate structures, and subsequently a plurality of layers of horizontal word line portions arranged at intervals are stacked in the direction perpendicular to the surface of the substrate, such that the horizontal word line portions are connected to the corresponding gate structures by means of the bridge word line portion. Compared to directly forming the plurality of layers of word line structures, on the outer sides of the gate structures, stacked in the direction perpendicular to the surface of the substrate, space volume occupied by the word line structures and the pitch between the adjacent word line structures can be increased at least under the condition that the number of the memory cells per unit volume is not reduced, thereby improving the performance and the reliability of the products fabricated while reducing the complexity of the fabrication processes.

As an example, with continued reference to FIG. 13, the target semiconductor layer in the memory cell structure 200 extends along the ox direction, and a first type of doping such as P-type light doping may be employed. A channel region conductive layer (not shown in the figure) is positioned between the source structure 191 and the drain structure 192, and may employ a first type of doping such as P-type heavy doping to form a channel region of a transistor. The drain structure 192 may employ a second type of doping such as N-type heavy doping to form a drain region of the transistor. The source structure 191 may employ the second type of doping such as N-type heavy doping to form a source region of the transistor. The P-type impurity ions may include, but are not limited to, any one or more of boron (B) ions, gallium (Ga) ions, boron fluoride ($BF_2$) ions, indium (In) ions, and the like. The N-type impurity ions may include, but are not limited to, any one or more of phosphorus (P) ions, arsenic (As) ions, antimony (Sb) ions, and the like.

Figure 14:
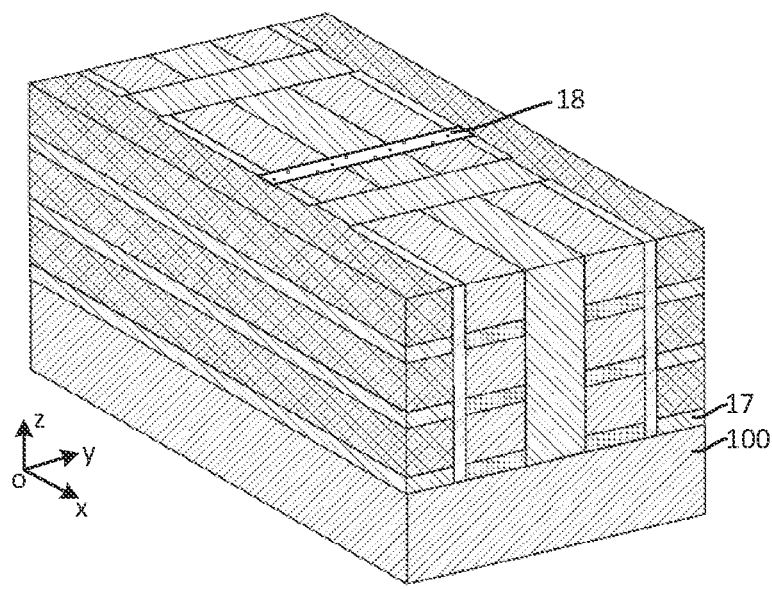
Figure 15:
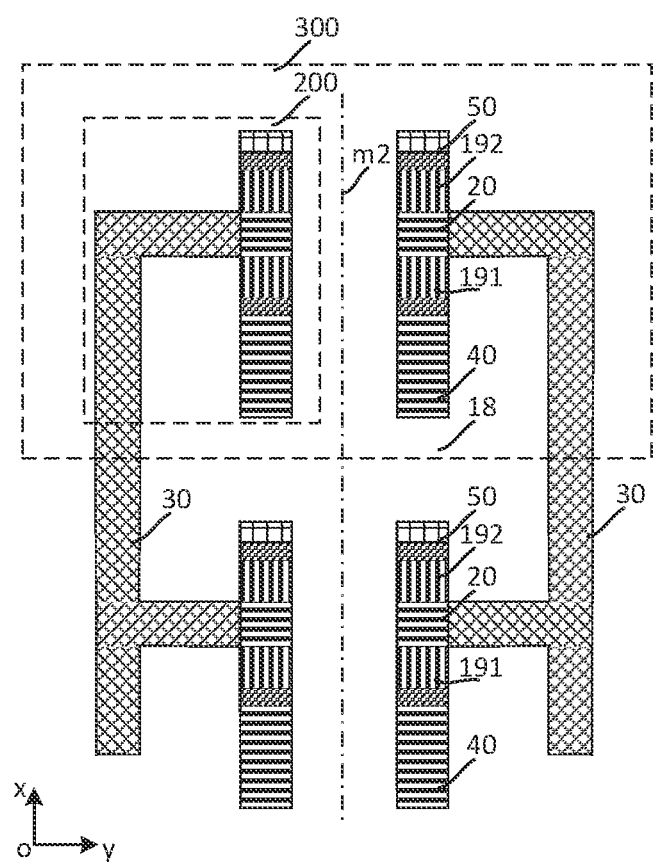
FIG. 15 is a schematic vertical view of a memory cell structure according to another embodiment of the present disclosure; where An oz direction may be a first direction, an oy direction may be a second direction, an ox direction may be a third direction, and an oz direction may be a height/thickness direction.

As an example, referring to FIG. 14 and FIG. 15, after forming the third low dielectric constant material layer 17 in the word line isolation trench in Step S172, the method may further include following steps: Step S181: forming, between the two gate trenches 14, a body isolation structure 18 whose bottom surface contacts the upper surface of the substrate 100; and Step S183: forming a source structure 191 and a drain structure 192 on the target semiconductor layer positioned on two opposite sides of each of the gate structures 20 along the third direction (e.g., the ox direction), where the source structure 191 is positioned between each of the gate structures 20 and the body isolation structure 18.

As an example, with continued reference to FIG. 15, a plurality of body structures 300 arranged at intervals along the oz direction are obtained by means of the method for fabricating the semiconductor structure in the embodiments of the present disclosure. Each of the body structures 300 includes the memory cell structures 200 symmetrical about the symmetrical axis m2; and the target semiconductor layer in the memory cell structure 200 extends along the ox direction, and the first type of doping such as P-type light doping may be employed. A channel region conductive layer (not shown in the figure) is positioned between the source structure 191 and the drain structure 192, and may employ a first type of doping such as P-type heavy doping to form a channel region of a transistor. The drain structure 192 may employ a second type of doping such as N-type heavy doping to form a drain region of the transistor. The source structure 191 may employ the second type of doping such as N-type heavy doping to form a source region of the transistor. The P-type impurity ions may include, but are not limited to, any one or more of boron (B) ions, gallium (Ga) ions, boron fluoride ($BF_2$) ions, indium (In) ions, and the like. The N-type impurity ions may include, but are not limited to, any one or more of phosphorus (P) ions, arsenic (As) ions, antimony (Sb) ions, and the like.

It is to be understood that although the steps in the flowchart of FIG. 1 are sequentially displayed as indicated by the arrows, these steps are not necessarily sequentially performed in the order indicated by the arrows. Unless expressly stated herein, the execution of these steps is not strictly restrictive and may be performed in other order. Moreover, at least a part of the steps in FIG. 1 may include a plurality of steps or a plurality of stages, which are not necessarily performed at the same moment, but may be executed at different moments, and the order of execution of these steps or stages is not necessarily performed sequentially, but may be performed alternately or alternately with at least a part of the steps or stages of other steps or other steps.

Referring to FIG. 5a to FIG. 5c, the semiconductor structure provided in the embodiments of the present disclosure includes the substrate 100 and the initial stack structure on the substrate 100. The initial stack structure includes the first dielectric layer 11 and the target semiconductor layer 12 alternately stacked in sequence along the first direction (e.g., the oz direction); and the first dielectric layer 11 is adjacent to the substrate 100. The first trench isolation structure 131, the second trench isolation structure 132, and the third trench isolation structure 133 arranged at intervals along the second direction (e.g., the oy direction) and extending along the third direction (e.g., the ox direction) are formed in the initial stack structure; and the bottom surface of the first trench isolation structure 131, the bottom surface of the second trench isolation structure 132, and the bottom surface of the third trench isolation structure 133 contact the upper surface of the substrate 100. Two spaced gate trenches 14 whose bottom surfaces contact the upper surface of the substrate are formed in the initial stack structure; and a part of the target semiconductor layer 12 positioned in the gate trenches 14 is exposed and suspended. The gate structures 20 are arranged around the outer side of the target semiconductor layer 12 in the gate trenches 14; and the gate structures 20 adjacent along the first direction (e.g., the oz direction) and the second direction (e.g., the oy direction) are insulated from each other. The first direction, the second direction, and the third direction are perpendicular to one another. A part of the target semiconductor layer exposed and suspended in the gate trenches may be trimmed and changed before the gate structures are formed, such that the dimensions of the gate structures formed subsequently may be controlled. The first trench isolation structure and the third trench isolation structure may be employed to form the bridge word line portion connected to the gate structures, and subsequently a plurality of layers of horizontal word line portions arranged at intervals are stacked in the direction perpendicular to the surface of the substrate, such that the horizontal word line portions are connected to the corresponding gate structures by means of the bridge word line portion. Compared to directly forming the plurality of layers of word line structures, on the outer sides of the gate structures, stacked in the direction perpendicular to the surface of the substrate, space volume occupied by the word line structures and the pitch between the adjacent word line structures can be increased at least under the condition that the number of the memory cells per unit volume is not reduced, thereby improving the performance and the reliability of the products fabricated while reducing the complexity of the fabrication processes.

It is to be noted that the above embodiments are intended for purposes of illustration only and are not intended to limit the present disclosure. The embodiments in the specification are described in a progressive manner. Each embodiment is focused on difference from other embodiments. And cross reference is available for identical or similar parts among different embodiments.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification. The above embodiments merely express several implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A method for fabricating a semiconductor structure, comprising:
providing a substrate, and forming an initial stack structure on the substrate, wherein the initial stack structure comprises a first dielectric layer and a target semiconductor layer alternately stacked in sequence along a first direction, the first dielectric layer being adjacent to the substrate;
forming, in the initial stack structure, a first trench isolation structure, a second trench isolation structure and a third trench isolation structure arranged at intervals along a second direction and extending along a third direction;
forming two spaced gate trenches whose bottom surfaces contact an upper surface of the substrate, a part of the target semiconductor layer positioned in the gate trench being exposed and suspended; and
forming gate structures surrounding the target semiconductor layer in the gate trenches, adjacent two of the gate structures along the first direction and the second direction being insulated from each other, wherein the first direction, the second direction, and the third direction are perpendicular to one another.

2. The method for fabricating the semiconductor structure according to claim 1, wherein an upper surface of the first trench isolation structure, an upper surface of the second trench isolation structure, and an upper surface of the third trench isolation structure are flush with an upper surface of the initial stack structure; and the forming the two spaced gate trenches whose bottom surfaces contact the upper surface of the substrate comprises:
forming a first mask layer, wherein the first mask layer covers the upper surface of the first trench isolation structure, the upper surface of the second trench isolation structure, and the upper surface of the third trench isolation structure; and
patterning the first mask layer, and etching the initial stack structure using the first mask layer patterned as a mask to obtain the gate trenches, wherein a remaining part of the first trench isolation structure and a remaining part of the third trench isolation structure positioned on two opposite sides of each of the gate trenches along the second direction constitute a first side wall of each of the gate trenches.

3. The method for fabricating the semiconductor structure according to claim 2, wherein the forming the gate structures surrounding the target semiconductor layer in the gate trenches comprises:
trimming a part of the target semiconductor layer positioned in the gate trenches along an inner diameter direction of the target semiconductor layer to obtain a gate support pillar;
forming a gate oxide layer on an outer surface of the gate support pillar; and
depositing a metal material layer, a part of the metal material layer surrounding the gate oxide layer constituting a gate metal layer, wherein the gate oxide layer and the gate metal layer constitute the gate structures.

4. The method for fabricating the semiconductor structure according to claim 3, wherein a part of the metal material layer positioned on the first side wall constitutes a second side wall; and after forming the gate structures surrounding the target semiconductor layer in the gate trenches, the method comprises:
filling a first low dielectric constant material layer in the gate trenches, an upper surface of the first low dielectric constant material layer being flush with the upper surface of the initial stack structure;
removing the first side wall, the second side wall, and part of the initial stack structure to obtain a word line auxiliary trench extending along the third direction and having a bottom surface contacting the upper surface of the substrate; and
filling a second low dielectric constant material layer in the word line auxiliary trench, an upper surface of the second low dielectric constant material layer being flush with the upper surface of the initial stack structure.

5. The method for fabricating the semiconductor structure according to claim 4, wherein after forming the gate structures surrounding the target semiconductor layer in the gate trenches, the method further comprises:
removing a part of the target semiconductor layer positioned on two opposite sides of each of the gate trenches along the second direction, and removing a part of the second low dielectric constant material layer positioned between adjacent two of the first dielectric layers along the first direction to obtain a first word line portion trench;
etching the first low dielectric constant material layer along the second direction using the gate metal layer as an etching stop layer, to obtain a second word line portion trench; and
forming a first word line portion in the first word line portion trench, and forming a second word line portion in the second word line portion trench, wherein the first word line portion and the second word line portion constitute a word line structure.

6. The method for fabricating the semiconductor structure according to claim 5, wherein after forming the word line structure, the method comprises:
removing a part of the first dielectric layer positioned on two opposite sides of each of the gate trenches along the second direction to obtain a word line isolation trench; and
forming a third low dielectric constant material layer in the word line isolation trench.

7. The method for fabricating the semiconductor structure according to claim 6, wherein the two gate trenches are symmetrical to each other along the third direction; and after forming the third low dielectric constant material layer in the word line isolation trench, the method comprises:
forming, between the two gate trenches, a body isolation structure whose bottom surface contacts the upper surface of the substrate; and
forming a source structure between the body isolation structure and the gate structure adjacent thereto, and forming a drain structure on a side of the gate structure distant from the body isolation structure along the third direction.

8. The method for fabricating the semiconductor structure according to claim 6, wherein after forming the third low dielectric constant material layer in the word line isolation trench, the method further comprises:
forming, between the two gate trenches, a body isolation structure whose bottom surface contacts the upper surface of the substrate; and
forming a source structure and a drain structure on the target semiconductor layer positioned on two opposite sides of each of the gate structures along the third direction, the source structure being positioned between each of the gate structures and the body isolation structure.

9. The method for fabricating the semiconductor structure according to claim 7, wherein after forming the third low dielectric constant material layer in the word line isolation trench, the method further comprises:

forming a capacitor structure on the target semiconductor layer between the body isolation structure and the source structure, and forming a bit line structure on the target semiconductor layer on a side of the drain structure distant from the capacitor structure along the third direction.

10. The method for fabricating the semiconductor structure according to claim 7, wherein adjacent two of the source structures along the third direction are symmetrical along the third direction; and/or adjacent two of the drain structures along the third direction are symmetrical along the third direction.

11. The method for fabricating the semiconductor structure according to claim 5, wherein the first word line portion and the second word line portion are fabricated in a same process step.

12. The method for fabricating the semiconductor structure according to claim 5, wherein a length of the second word line portion along the third direction is equal to a length of each of the gate structures along the third direction.

13. The method for fabricating the semiconductor structure according to claim 1, wherein the initial stack structure is symmetrical along the second direction with a symmetrical axis of the second trench isolation structure extending along the third direction.

14. The method for fabricating the semiconductor structure according to claim 6, wherein at least two of the first low dielectric constant material layer, the second low dielectric constant material layer and the third low dielectric constant material layer have a same material.

* * * * *